(12) United States Patent
Peters et al.

(10) Patent No.: US 12,292,263 B2
(45) Date of Patent: May 6, 2025

(54) SAFETY ASSEMBLY FOR TRAINING USE OF A LASER-DIRECTED ENERGY WEAPON

(71) Applicant: MBDA UK LIMITED, Stevenage (GB)

(72) Inventors: Andrew Peters, Filton (GB); Jon Daw, Filton (GB); Martyn Robert Jennings, Filton (GB); William Michael George Halstead, Filton (GB); Colin Bridgewater, Filton (GB); Mark Owen, Filton (GB)

(73) Assignee: MBDA UK LIMITED, Stevenage (GB)

( * ) Notice: Subject to any disclaimer, the term of this patent is extended or adjusted under 35 U.S.C. 154(b) by 0 days.

(21) Appl. No.: 17/924,397

(22) PCT Filed: May 10, 2021

(86) PCT No.: PCT/GB2021/051119
§ 371 (c)(1),
(2) Date: Nov. 10, 2022

(87) PCT Pub. No.: WO2021/229208
PCT Pub. Date: Nov. 18, 2021

(65) Prior Publication Data
US 2023/0184519 A1 Jun. 15, 2023

(30) Foreign Application Priority Data

May 12, 2020 (GB) ...................................... 2007108

(51) Int. Cl.
*F41H 13/00* (2006.01)
*F41A 17/08* (2006.01)
(Continued)

(52) U.S. Cl.
CPC .......... *F41H 13/0062* (2013.01); *F41A 17/08* (2013.01); *F41G 3/26* (2013.01);
(Continued)

(58) Field of Classification Search
CPC ............... F41H 13/0062; F41H 13/005; F41H 13/0056; F41H 13/0043; H01S 5/0028;
(Continued)

(56) References Cited

U.S. PATENT DOCUMENTS

2002/0045999 A1  4/2002  Bollweg et al.
2014/0109458 A1* 4/2014  Maryfield ................. F41G 1/38
                                        356/4.01
(Continued)

FOREIGN PATENT DOCUMENTS

DE    3405017 A1    8/1985
JP    2003042696 A  2/2003
WO    2007105194 A1 9/2007

OTHER PUBLICATIONS

International Search Report and Written Opinion dated Sep. 3, 2021 issued in PCT/GB2021/051119.
GB Search Report dated Nov. 10, 2020 issued in GB 2007108.0.

*Primary Examiner* — Jennifer D Bennett
*Assistant Examiner* — Erin R Garber
(74) *Attorney, Agent, or Firm* — Scully, Scott, Murphy & Presser, P.C.

(57) ABSTRACT

A safety assembly for use with a laser-directed energy weapon is disclosed. The assembly comprises a control system comprising a photodetector and a processing unit; and an optical device configured to attach to a target such that, when attached, the optical device provides a light beam to the photodetector. The processing unit is arranged to compare the received light beam against one or more predetermined attributes, and to permit the laser-directed (Continued)

energy weapon to fire only when the received light beam is determined to have the one or more attributes.

20 Claims, 8 Drawing Sheets

(51) Int. Cl.
    *F41G 3/26*     (2006.01)
    *H01S 5/00*     (2006.01)
    *F41A 33/02*     (2006.01)
    *F41G 3/32*     (2006.01)
    *F41J 2/02*     (2006.01)

(52) U.S. Cl.
    CPC ......... *F41G 3/2683* (2013.01); *F41H 13/005* (2013.01); *H01S 5/0028* (2013.01); *F41A 33/02* (2013.01); *F41G 3/2655* (2013.01); *F41G 3/32* (2013.01); *F41J 2/02* (2013.01)

(58) Field of Classification Search
    CPC ........ F41A 33/02; F41A 17/063; F41A 17/08; F41A 17/00; F41G 3/2655; F41G 3/2683; F41G 3/32; F41G 3/26; F41J 5/02; F41J 2/02

See application file for complete search history.

(56) References Cited

U.S. PATENT DOCUMENTS

| | | | |
|---|---|---|---|
| 2018/0136364 A1* | 5/2018 | Kare | G01S 7/003 |
| 2019/0064353 A1 | 2/2019 | Nugent, Jr. et al. | |
| 2019/0383574 A1 | 12/2019 | Lindero | |
| 2020/0033458 A1* | 1/2020 | Stryjewski | H04B 10/118 |
| 2021/0063764 A1* | 3/2021 | Braunreiter | F41G 7/224 |
| 2022/0099413 A1* | 3/2022 | Newton | H01Q 13/20 |

* cited by examiner

SAFETY ASSEMBLY FOR TRAINING USE OF A LASER-DIRECTED ENERGY WEAPON

FIELD OF THE INVENTION

The present invention concerns safety assemblies, for example for use in testing of laser-directed energy weapons. The present invention also concerns laser-directed energy weapon safety systems and methods of preventing firing of laser-directed energy weapons.

BACKGROUND

During testing of laser-directed energy weapons or during operator training, it is important to constrain the high-energy laser radiation emitted by the weapon to a precisely defined area to prevent unwanted burns, or other harm. It is also important to minimise the time period between instigating switch-off of the laser-directed energy weapon, and switch-off occurring, to prevent damaging effects occurring after switch-off has been initiated. In other words, the switch-off time of the weapon should be as fast as possible.

For static targets, there are several known ways of constraining a laser-directed energy weapon laser beam to a well-defined area, including using physically restrained pointing systems (e.g. gimbal system end-stops), placing large backstops behind the targets or using letterbox apertures to constrain the beam path. These methods are generally unsuitable for moving targets, and are particularly unsuitable for moving targets engaged from moving platforms due to the uncertainties (i.e. the error margins) introduced by the relative motion of the target and platform.

There is a need for an improved means of constraining a laser-directed energy weapon laser beam to a well-defined area, or otherwise verifying pointing direction with high precision.

Traditional switch-off methods necessitate large buffer regions (due to the combination of a long switch-off period and a high tracking system slew rate) between the permitted firing region and any no-fire zone. For moving platforms, additional buffer angles are required to accommodate for the maximum movement of the platform. For example in maritime systems, the ship roll and pitch depends on the sea state, which makes beam control in elevation and avoidance of collateral assets such as aircraft and satellites extremely challenging, especially during weapon training.

The requirement for large buffer regions makes many scenarios impossible, leading to a system under test or training that is not representative of the in-service use case.

There is therefore also a need for an improved means of switching off a laser-directed energy weapon.

In summary, there is a need for a new laser-directed energy weapon safety system or method of use, which overcomes the aforementioned drawbacks and/or provides high integrity confirmation and control of pointing and improved safety during testing and training operations.

SUMMARY OF THE INVENTION

In a first aspect of the invention there is provided a safety assembly for use with a laser-directed energy weapon, the safety assembly comprising: a control system comprising a photodetector and a processing unit; an optical device configured to attach to a target such that, when attached, the optical device provides a light beam to the photodetector; the processing unit being arranged to compare the received light beam against one or more predetermined attributes, and to permit the laser-directed energy weapon to fire only when the received light beam is determined to have the one or more attributes.

The one or more attributes may include a modulation signal, for example a frequency modulation signal. The one or more attributes may include receipt of a light beam of a particular colour. In that example, a colour filter may be used such that only light of a particular colour can reach the photodetector. In such a case, the one or more attributes may essentially be the receipt of the light beam. The one or more attributes may include a light pattern, or any other properties of an optical signal which can distinguish the received light beam.

Compared to safety systems of the prior art, the present safety beacon enables a firing region to be defined very precisely through high integrity confirmation of pointing, therefore reducing the risk of bodily harm or other damage in training and/or testing exercises. The safety assembly instigates shut-down in the absence of determination of the expected attributes, which may include the total absence of the light beam altogether, or loss of the light beam (after an earlier positive determination), and/or a mismatch between the detected and expected signals. The safety assembly therefore accommodates scenarios in which pointing is not confirmed, and scenarios in which pointing is confirmed and subsequently lost.

Unlike safety systems of the prior art, the present safety beacon is suitable for use with the combination of a moving platform and a moving target, in addition to static platforms and targets.

The processing unit may be arranged to prevent the laser-directed energy weapon from firing when no light beam is received. Such a safety assembly requires positive confirmation of permission to fire, with a default position of no-fire, thus improving safety in use.

The optical device may be configured to provide a light beam continuously to the photodetector. Such a safety assembly may enable continuous, almost instantaneous feedback from the target to confirm its position relative to the laser-directed energy weapon in real-time, further improving precision of firing, and preventing shut-off delays.

The optical device may comprise a light source. A light source may provide high spatial resolution, and therefore improved precision, compared to a sound wave or other source.

The optical device may comprise a retro-reflector, and the control system may comprise a light source, wherein when attached to the target, the optical device provides a reflected light beam to the photodetector. In such a safety assembly, the active components may be co-located in one, easily accessible place.

The light source may be a laser diode. A laser diode may be particularly suitable for providing optical feedback over distances of several kilometres (even up to hundreds of kilometres) typically used in training and/or testing exercises.

The laser diode may be configured to emit a frequency modulated light beam. The frequency modulated light beam may be modulated using the known reference signal. Alternatively some other modulation scheme may be used, as long as it is known to the control system.

The processing unit may be arranged to demodulate the light beam received by the photodetector. Such an arrangement may facilitate a comparison between the received and expected signals. Alternatively, signal processing may be undertaken in an external unit.

The laser diode may be configured to emit light with a modulation frequency in excess of 100 Hz, for example in excess of 1000 Hz. Such a modulation frequency may negate the effects of atmospheric turbulence (the effects of thermal eddies on refractive index), improving reliability of the safety assembly. The laser diode may be configured such that in use, the emitted light has a wavelength distinct from the wavelengths of a main laser comprised in the laser-directed energy weapon. Such a feature may ensure integrity of measurement, and avoid interference.

The optical device may be configured to provide a wide-angle light beam. The wide-angle light beam may have a broad cone shape, for example defined by a diversion angle of greater than 45 degrees, more preferably greater than 60 degrees. The broad cone shape may be provided for example, by a single laser diode and a diverging lens, or via multiple laser diodes in different orientations. A wide-angle light beam advantageously maximises the chances of the feedback signal from the target being detected by the control system, thus improving the chances of an accurate determination (improving usability).

The control system may comprise one or more dichroic mirrors. Dichroic mirrors may advantageously allow passage of light of only specific wavelengths, reflecting others. Such an arrangement may be useful for providing a safety assembly co-boresighted with the pointing system. Alternatively, the dichroic mirrors may not be present in the control system, with alternative optical components provided, or the dichroic mirrors forming part of the established pointing system of the laser-directed energy weapon.

The processing unit may be arranged to output a PERMIT signal upon determining that the received light beam has the one or more attributes and to not output a PERMIT signal in the absence of such a determination. The PERMIT signal may be output (directly or indirectly) to the high-energy laser of the laser-directed energy weapon. In such a safety assembly, the absence of a positive determination may indicate loss of pointing, or a total failure to establish pointing. Such a feature may improve safety and reliability, since the default position is no fire. Alternatively, the signal processing and output of the PERMIT signal may be undertaken in conjunction with an external control unit.

The processing unit may be arranged to output an INHIBIT signal in the absence of such a determination. The INHIBIT signal may be output to the high-energy laser of the laser-directed energy weapon. Alternatively, the signal processing and output of the INHIBIT signal may be undertaken in conjunction with an external control unit.

The control system may further comprise an aperture arranged with respect to the photodetector to constrict the photodetector field of view. The aperture size may be set upon manufacture and installation. Alternatively, the aperture size may be adjustable by an operator during use, to alter the field of view.

The safety assembly may be configured to attach to a laser-directed energy weapon, such that when attached, the photodetector field of view aligns with the laser-directed energy weapon boresight. Such a co-boresight may minimise required modifications and enable re-use of existing components, thus reducing weight and complexity overall.

The safety assembly may comprise a radio frequency emitter associated with the control system, and a radio frequency receiver associated with the optical device, the radio frequency emitter and receiver being arranged in use to emit and receive respectively a specific frequency signal, wherein in the absence of receipt of the specific frequency signal the light source is disabled.

Such a feature may provide a high-integrity switching system, such that even upon correct confirmation of pointing, the laser-directed energy weapon can be prevented from firing. Therefore, safety may be improved, and or the system may be more versatile. The safety assembly may further comprise the target.

In a second aspect of the invention there is provided an optical device for use as the optical device in the safety assembly of the first aspect.

In a third aspect of the invention there is provided a control system for use as the control system in the safety assembly of the first aspect.

In a fourth aspect of the invention there is provided a laser-directed energy weapon safety system comprising a laser-directed energy weapon and the safety assembly of the first aspect.

In a fifth aspect of the invention there is provided a laser-directed energy weapon safety system comprising: a main laser configured to fire towards a target; a control system comprising a photodetector and a processing unit; an optical device, configured to attach to the target, such that when attached, the optical device provides a light beam to the photodetector; the processing unit being arranged to compare the received light beam against one or more predetermined attributes, and to permit the laser-directed energy weapon to fire only when the received light beam is determined to have the one or more attributes.

In a sixth aspect of the invention there is provided a method of preventing firing of a laser-directed energy weapon including the steps of: attaching an optical device to a target; attaching a photodetector to the laser-directed energy weapon; providing a light beam from the optical device to the photodetector; comparing the light beam received by the photodetector against one or more attributes; wherein only upon determining that the light beam has the one or more attributes, permitting the laser-directed energy weapon to fire.

The step of permitting the laser-directed energy weapon to fire may comprise outputting a PERMIT signal from the processing unit. The PERMIT signal may be output (directly or indirectly) to the high-energy laser to permit it to fire.

It will of course be appreciated that features described in relation to one aspect of the invention may be incorporated into other aspects of the invention. For example, the method of the invention may incorporate any of the features described with reference to the apparatus of the invention and vice versa.

DESCRIPTION OF THE DRAWINGS

Two embodiments of the invention will now be described by way of example only with reference to the accompanying schematic drawings of which.

DETAILED DESCRIPTION

Figure 1:
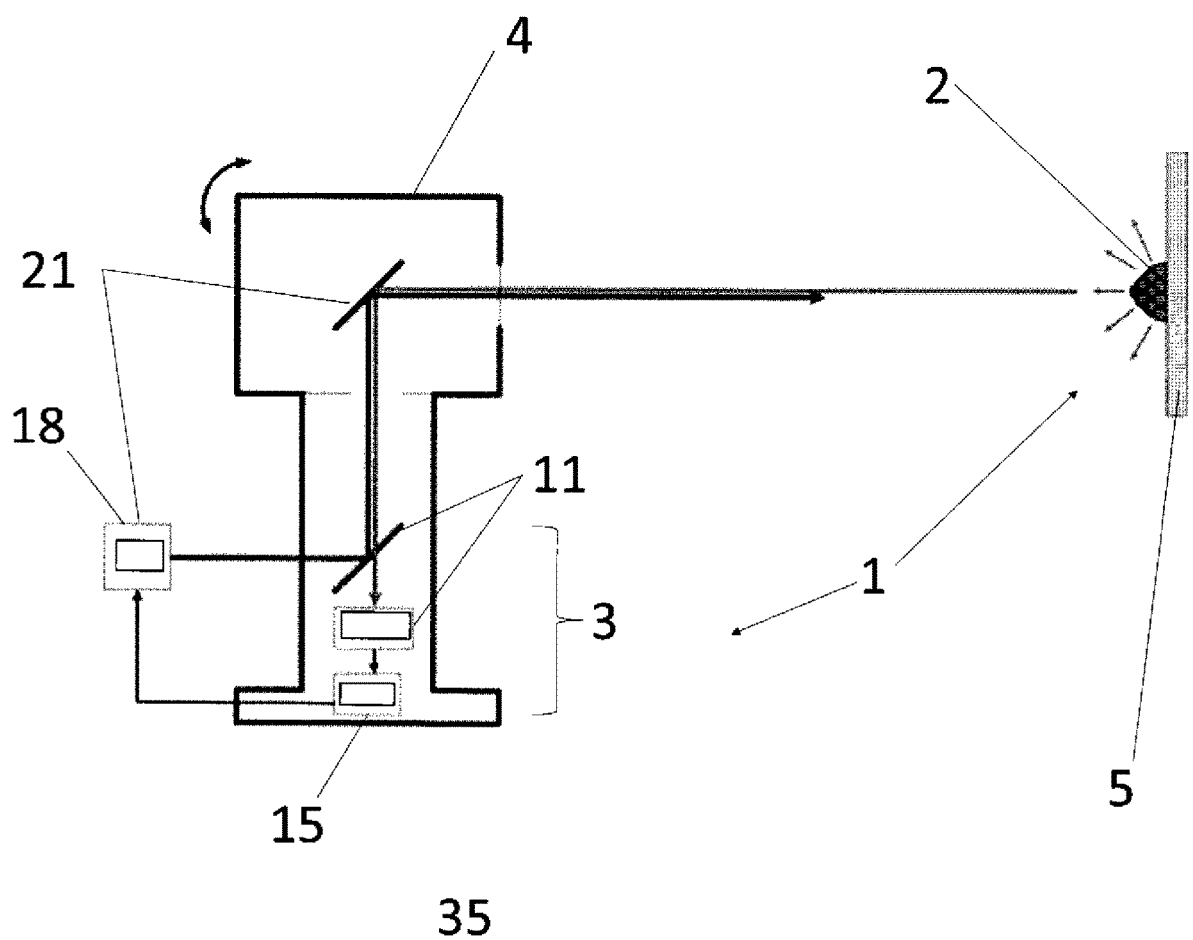
FIG. 1 is a schematic perspective view of a safety assembly according to the first example embodiment of the invention, shown in use, attached to a laser-directed energy weapon and target.

A safety assembly 1 (FIG. 1) according to the first example embodiment of the invention is integrated in a laser-directed energy weapon 4. The safety assembly 1 is turned on via a manually operated switch (not shown) when it is required to test the laser-directed energy weapon or use it in training. Otherwise, in a combat scenario, the safety assembly 1 is turned off, and the laser-directed energy weapon 4 operates as normal, as if the safety assembly 1 were not present.

The safety assembly 1 comprises an optical device 2, and a control system 3. The control system 3 includes optical components 11 and a processing unit 15. The optical device 2 is attached to a target 5. In use during training or testing, the target 5 is typically positioned several kilometres away from the laser-directed energy weapon 4, but may be used tens or hundreds of kilometres away. The laser-directed energy weapon 4 has a standard construction, including a tracking system (not shown) and a pointing system 21, and suitable fixings for attaching to a platform (not shown) such as an aircraft or ship. The pointing system 21 includes a high-energy laser 18 which fires towards the target 5. In the first example embodiment of the invention, both of the platform (not shown) and the target 5, are dynamic.

Figure 2:
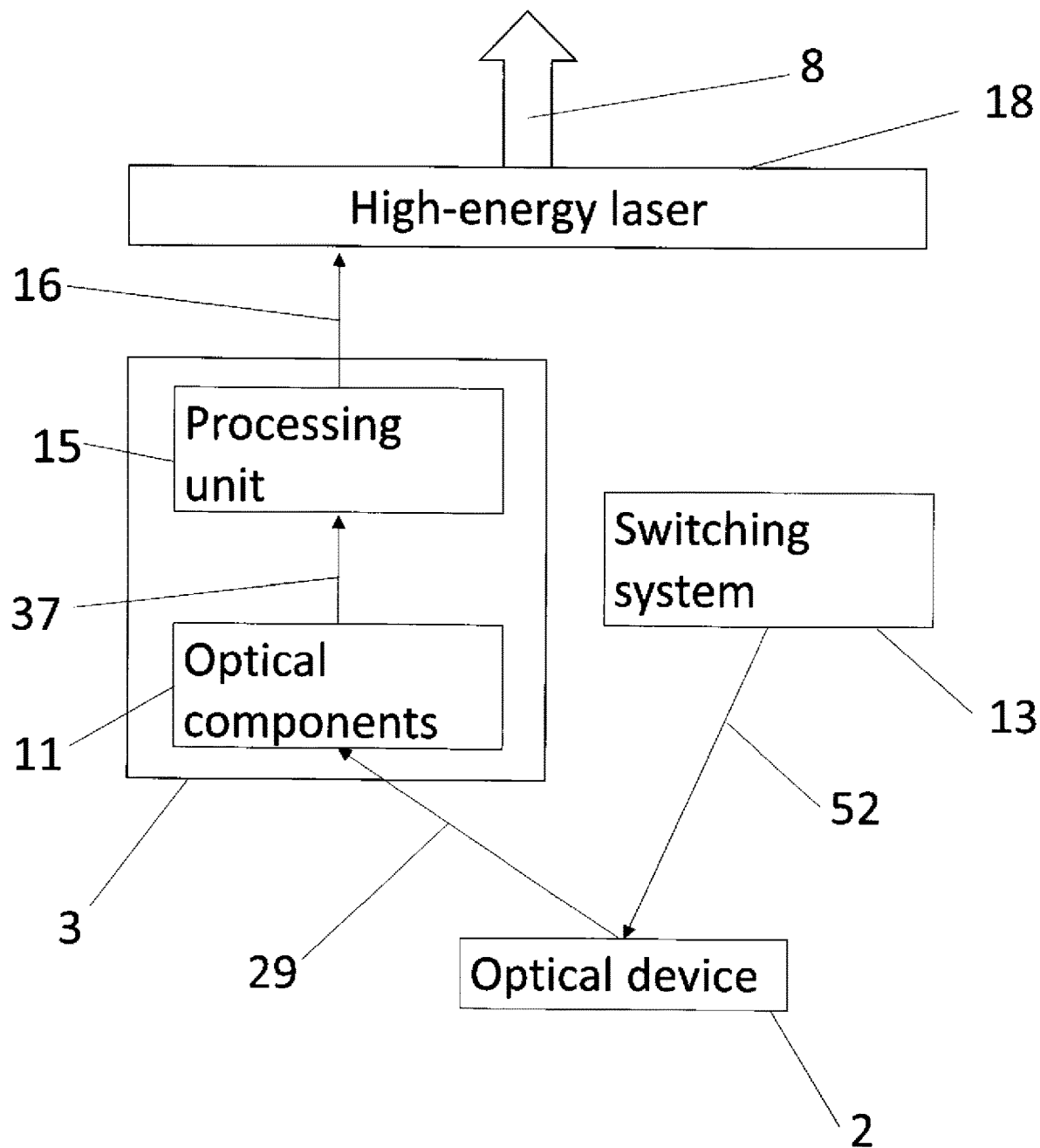
FIG. 2 is a high-level schematic diagram of the control system of the safety assembly of FIG. 1.

As described above, the safety assembly 1 includes a control system 3 and an optical device (FIG. 2). In the present example embodiment of the invention, the safety assembly 1 also includes a switching system 13. The optical device 2 is used to provide feedback to the control system 3 regarding the position of the target 5, so that pointing direction can be verified prior to the high-energy laser 18 firing.

The optical device 2 provides a light beam 29 to the control system 3 which is received by optical components 11. A signal 37 is output from the optical components 11 to the processing unit 15. The processing unit 15 then processes the signal 37 and compares it against one or more previously determined attributes (in the present example embodiment the one or more previously determined attributes is a known frequency modulation signal), and outputs a PERMIT or INHIBIT signal 16 based on the result of the comparison to the high-energy laser 18, to permit or prevent it from firing a high-energy laser beam 8. Thus, only when the received signal matches certain pre-determined expectations is the high-energy laser 18 permitted to fire. The switching system 13 is used to indirectly control the high-energy laser 18 by providing a radio-frequency signal 52 to the optical device 2, which enables or disables the optical device 2 depending on whether or not the signal 52 is determined to have a certain expected frequency.

Figure 3:
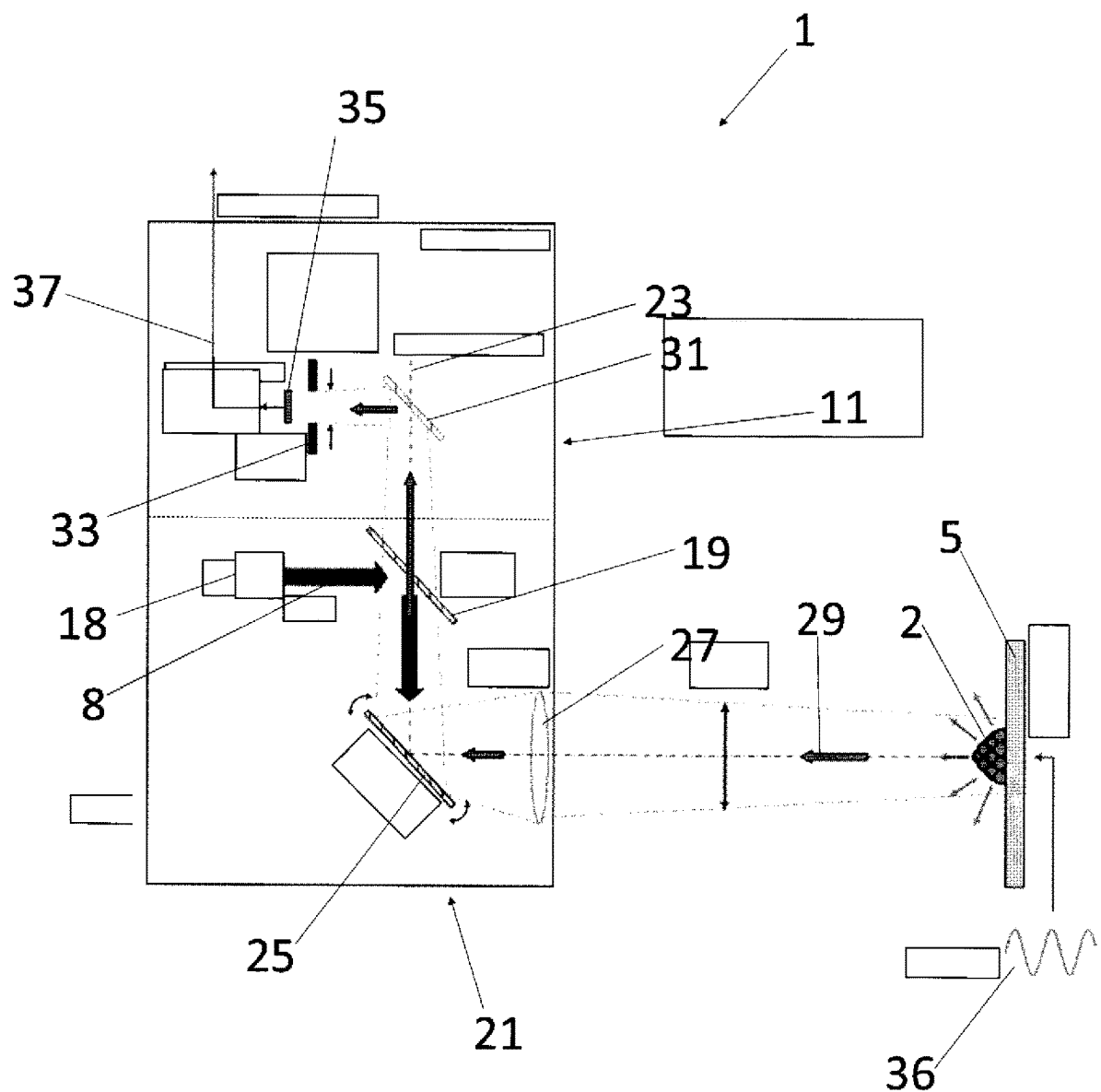
FIG. 3 is a schematic diagram of the components of the safety assembly of FIG. 1 integrated with the target and the pointing system of the laser-directed energy weapon.

The optical components 11 are arranged (FIG. 3) to align with the pointing system 21. As is known in the art, the pointing system 21 includes the high-power laser 18 and a first dichroic mirror 19. The pointing system 21 emits the high-energy laser beam 8 towards a first dichroic mirror 19. The first dichroic mirror 19 is angled with respect to the high-power laser 18 to reflect the high-energy laser beam 8 along the pointing system boresight 23. A pointing mirror 25 in the path of the high-energy laser beam 8 directs the high-energy laser beam 8 towards the target 5 via a lens 27. Finally, the high-energy laser beam 8 is emitted from the pointing system 21 towards the target 5.

The optical device 2 in the first example embodiment of the invention (FIG. 3) is a laser diode, attached to the target 5 and arranged to emit a laser beam 29. Whilst during combat, such a marking/modification of a target would not be possible, in a training or testing scenario where additional safety measures are required, the target 5 can be set up prior to firing the high-energy laser 18.

The optical components 11 (FIG. 3) in the control system 3 of the safety assembly 1 are arranged in line with the pointing system 21, and include a photodetector 35, aperture 33 and second dichroic mirror 31. The photodetector 35 field of view is co-boresighted with the pointing system 21.

The focussing lens 27 focusses the laser beam 29 emitted by the laser diode 2 on the pointing mirror 25 of the pointing system 21. The laser beam 29 is reflected by the pointing mirror 25 along the pointing system boresight 23 in the direction of the first dichroic mirror 19. The laser beam 29 has a different wavelength to the high-energy laser beam 8 and is not reflected by the first dichroic mirror 19 but instead passes through it, towards the optical components 11 of the control system 3.

The laser beam 29 is then reflected by the second dichroic mirror 31 arranged to reflect the laser beam 29 through the aperture 33 to the photodetector 35. The photodetector 35 then outputs the corresponding signal 37 to the processing unit 15 (not shown). Whilst in the present example embodiment of the invention the optical device 2 is a laser diode, any suitable light source may be used.

In the first example embodiment of the invention, the light emitted by the laser diode 2 is pulsed using a known reference signal 36 (i.e. it is frequency modulated). In the present example embodiment of the invention a single frequency is used, however in other embodiments a multiple frequency reference signal may be used.

The laser diode 2 is designed such that its output has a broad divergence angle (in the present example embodiment approximately 90 degrees), to allow it to be seen in a wide range of orientations relative to the photodetector 35. The wavelength output of the laser diode 2 is chosen such that it does not overlap the wavebands of the high-energy laser beam 8. The laser beam 29 is modulated at a frequency, for example greater than 100 Hz, such that the effects of atmospheric turbulence are negated.

Figure 3A:
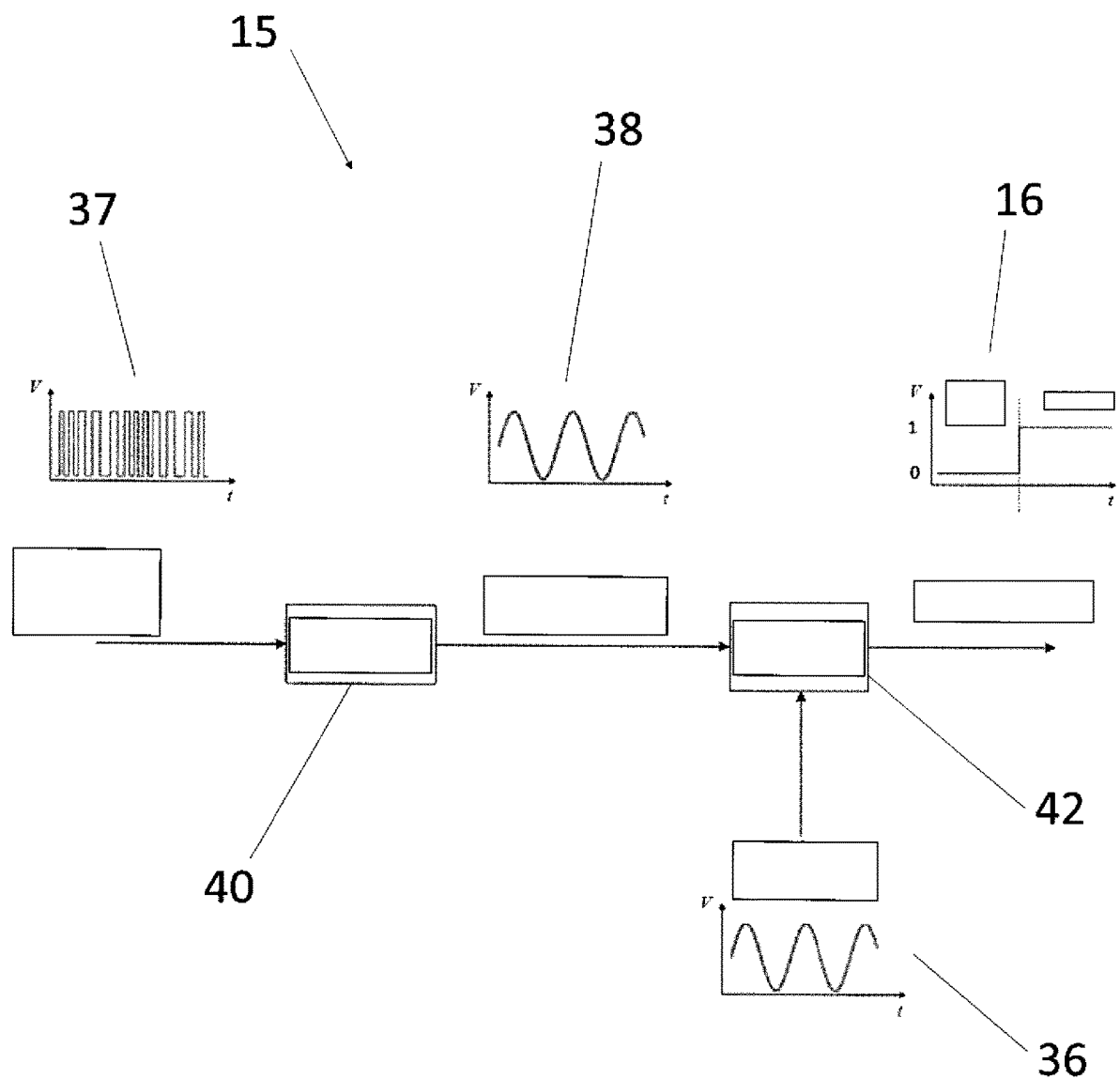
FIG. 3a is a schematic diagram of the processing unit of the safety assembly of FIG. 1.

In the processing unit 15, the received signal 37 is demodulated in hardware and compared to the known reference signal 36 (FIG. 3a). First, the received modulated signal 37 is input to a demodulator 40, which outputs a demodulated signal 38. Then the demodulated signal 38 is input to a comparator 42, which compares the demodulated signal 38 to the reference signal 36. Upon determination that the demodulated signal 38 matches the known reference signal 36, a HI PERMIT signal 16 is output from the processing unit 15 to the high-energy laser 18, which is then permitted to fire towards the target 5. In the absence of a match, a LO INHIBIT signal 16 is instead output to the high-energy laser 18, which is then restricted from firing. The LO INHIBIT signal 16 is received almost instantaneously after no match is detected, requiring the high-energy laser 18 to almost immediately stop firing if pointing is lost.

Figure 4:
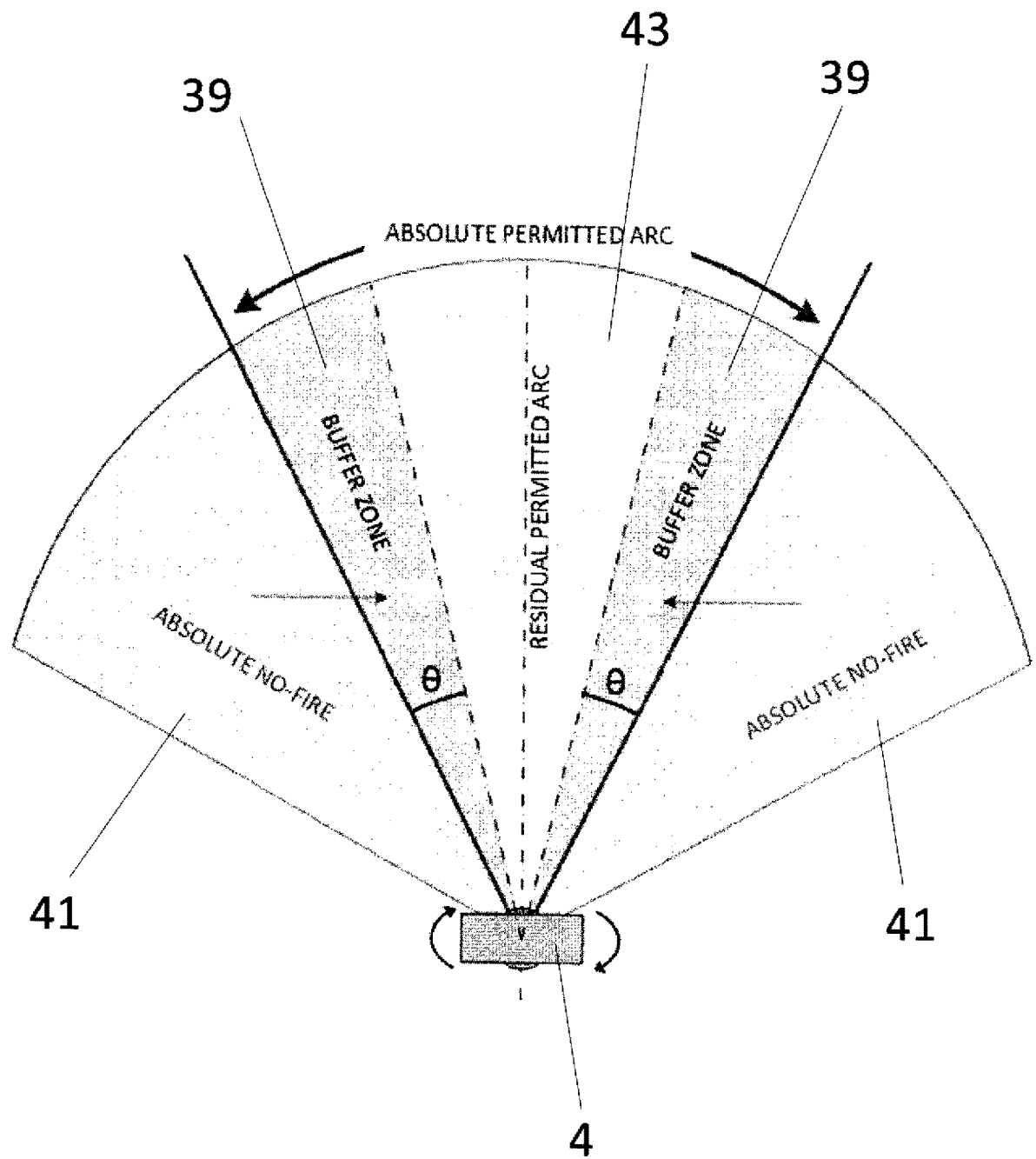
FIG. 4 is a schematic diagram showing the buffer zones around the permitted firing arc in accordance with the first example embodiment of the invention.

As a consequence, the buffer zones 39 (FIG. 4) required during training or testing exercises are greatly reduced compared to laser-directed energy weapon safety systems of the prior art which utilise slower shut-off mechanisms. With smaller buffer zones 39 adjacent the no-fire zones 41, smaller firing arcs (i.e. combining the permitted firing arc 43 and the buffer zones 39) are possible using the safety assembly 1 of the first example embodiment of the invention. In an alternative embodiment, the signal processing may be undertaken remotely from the safety assembly 1, with the HI PERMIT and LO INHIBIT signals provided via an external control unit.

Figure 5:
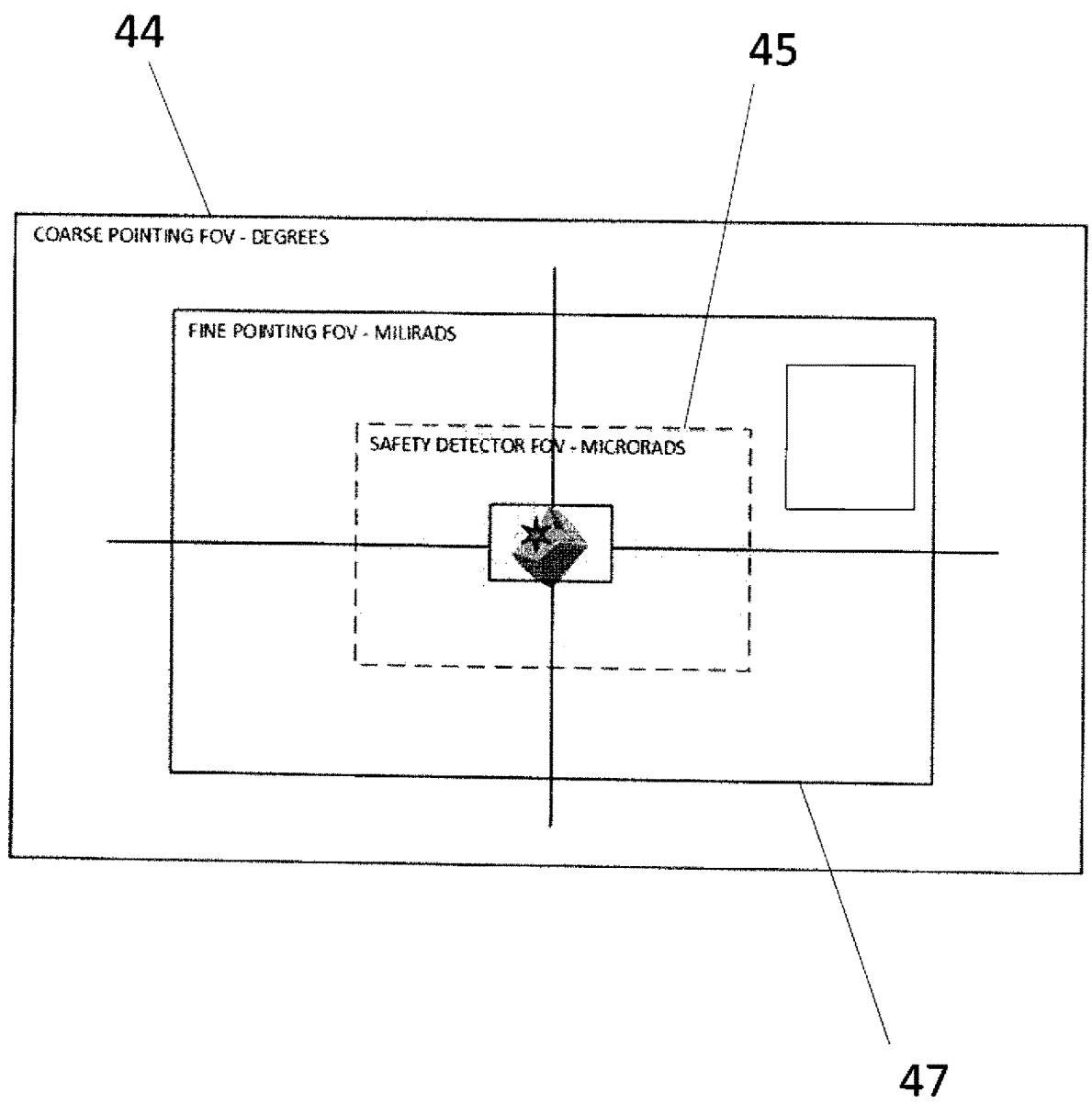
FIG. 5 is a schematic diagram of the photodetector field of view in accordance with the first example embodiment of the invention.

The aperture 33 in front of the photodetector 35 provides a larger or smaller field of view 45 (FIG. 5), as required by the operator. The aperture size can be adjustable in use, or can be a pre-set aperture size determined during manufacturing and assembly. The photodetector field of view 45 is smaller (i.e. of the order of microradians) than the standard coarse 44 or fine 47 pointing fields of view of the pointing system 21 which tend to be of the order of degrees or miliradians respectively.

Figure 6:
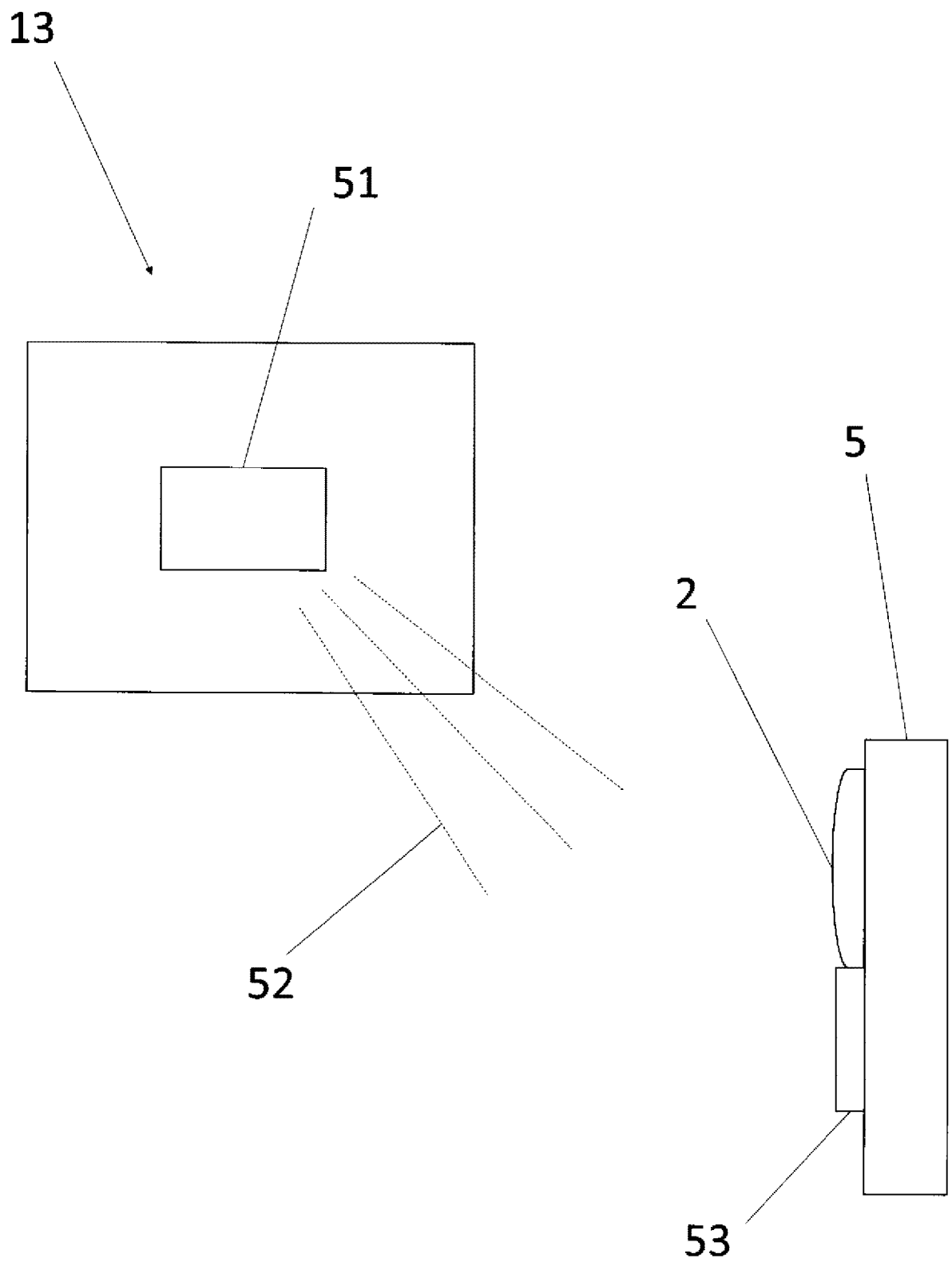
FIG. 6 is a schematic diagram of the switching system of the safety assembly of FIG. 1, and the target.

The switching system 13 (FIG. 6) in the control system 3 provides an independent control means to prevent accidental firing. The switching system 13 includes a radio frequency emitter 51 configured to emit a signal 52 with a specific frequency and a radio frequency receiver 53. The radio frequency emitter 51 is located adjacent the control system 3. The radio frequency receiver 51 is located with the optical device 2.

The radio frequency receiver 53 listens for the specific frequency signal 52. Only when the signal 52 is received, is a switch (not shown) activated to turn on the laser diode 2. Thus, even when the pointing and tracking systems are "locked on" to the target 5, the high-energy laser 18 is prevented from firing, providing an additional level of security. The switching system 13 provides an independent high integrity turn on/off mechanism for the laser diode 2, which in turn controls emissions from the high-energy laser 18.

To activate the switching system 13, the radio frequency emitter 51 can be manually switched on via a push-button switch (not shown).

In an alternative embodiment of the invention, the switching system 13 is omitted but instead the photodetector 35 is switched on or off by an operator.

Figure 7:
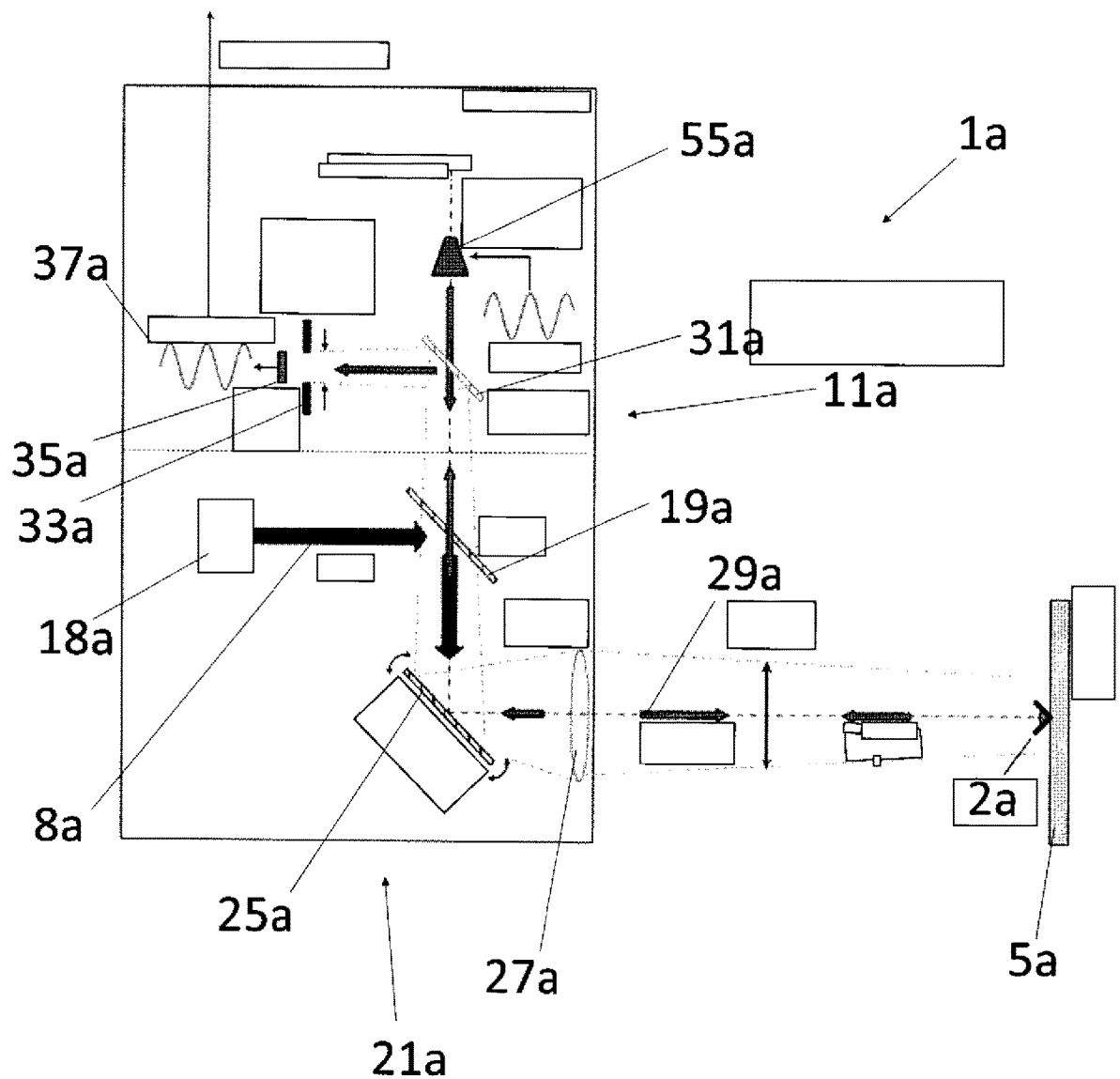
FIG. 7 is a schematic diagram of the components of the safety assembly of the second example embodiment of the invention, integrated with the target and the pointing system of the laser-directed energy weapon.

In the second example embodiment of the invention, the optical device of the safety assembly 1a is a retro-reflector 2a attached to the target 5a instead of a light source (FIG. 7). A light source in the form of a laser diode 55a is located with the optical components 11a in the control system. The other components of the safety assembly are similar to the first example embodiment, and like reference numerals denote similar parts. The second example embodiment of the invention does not include a switching system.

The laser diode 55a is arranged along the pointing system 21a boresight 23a such that the laser beam 29a passes through the second 31a and first 19a dichroic mirrors respectively, before being reflected by the pointing mirror 25a, out towards the target 5a. The safety assembly 1a operates in a similar manner to the safety assembly 1 of the first example embodiment of the invention except that the laser diode light beam 29a originates within the control system and is reflected from the target 5a, before being detected by the photodetector 35a. The arrangement of the second example embodiment of the invention may provide the benefit of retaining all active components within the control system (attached to the laser-directed energy weapon) for easier access. In the second example embodiment of the invention, the broad light beam is provided through a combination of a wide emitted beam angle from the laser diode 55a and the reflecting surface of the retroreflector 2a.

The safety assemblies 1, 1a of the example embodiments of the invention provide feedback on the pointing direction continuously via the optical device 2, 2a attached to the target 5, 5a. Thus the pointing direction can be confirmed to high accuracy, at all times and even when one of the platform, and/or the target 5, 5a, moves.

When the pointing direction cannot be confirmed, or is confirmed and then lost, the high-energy laser 18, 18a is quickly shut down. This provides a high level of confidence in training and testing scenarios, and higher overall safety compared to laser-directed energy weapon safety systems of the prior art. The safety assemblies of the example embodiments of the invention allow controlled firing into a well-defined area. In a further advantage over laser-directed energy weapon safety systems of the prior art, traditional restraints such as end-stops, backstops and letterboxes are not required.

As stated, the safety assemblies 1, 1a of the example embodiments of the invention can accommodate both a moving platform and a moving target 5, 5a during training or testing because the laser diode 2, 55a attached to the target 5, 5a has a broad divergence angle and continuously provides a light beam 29, 29a to the optical components 11, 11a, providing position feedback whatever the respective positions of the platform and target 5, 5a. Thus the example embodiments of the invention provide yet another advantage over laser-directed energy weapon safety systems of the prior art.

In yet a further advantage over laser-directed energy weapon safety systems of the prior art, the required buffer zones around the permitted firing arc are greatly reduced, since the removal of the PERMIT signal is almost instantaneous (leading to a reduced error margin). Therefore, the firing arcs (made up of the permitted firing arc and buffer zones) can be much smaller than possible using laser-directed energy weapon safety systems of the prior art, and multiple firing arcs can also be simulated.

Whilst the present invention has been described and illustrated with reference to particular embodiments, it will be appreciated by those of ordinary skill in the art that the invention lends itself to many different variations not specifically illustrated herein. By way of example only, certain possible variations will now be described.

For example, instead of a frequency modulated reference signal, some other "key" may be used, such as a specific colour of light, or light pattern. The "key" must transmit with high spatial resolution i.e. sound waves are unsuitable due to their divergence.

Instead of a laser diode, there may be an alternative light source. For example, in certain applications a light-emitting diode may be suitable.

The invention claimed is:

1. A safety assembly for a laser-directed energy weapon, the safety assembly comprising:
   a control system comprising a photodetector and a processing unit; and
   an optical device configured to attach to a target such that, when attached, the optical device provides a light beam to the photodetector for training use of a laser-directed energy weapon,
   wherein the processing unit is arranged to compare the light beam provided by the optical device and received by the photodetector against one or more predetermined attributes, and to permit the laser-directed energy weapon to fire only when the received light beam is determined to have the one or more predetermined attributes, wherein the safety assembly has a training mode and a combat mode which is selectable using a user interface, wherein when in the combat mode, the safety assembly including the optical device is disabled and in training mode the safety assembly is activated.

2. A safety assembly according to claim 1, wherein the processing unit is arranged to prevent the laser-directed energy weapon from firing when no light beam is received.

3. A safety assembly according to claim 1, wherein the optical device is configured to provide the light beam continuously to the photodetector.

4. A safety assembly according to claim 1, wherein the optical device comprises a light source.

5. A safety assembly according to claim 4, wherein the light source is a laser diode configured to emit a frequency modulated light beam.

6. A safety assembly according to claim 5, wherein the processing unit is arranged to demodulate the light beam received by the photodetector.

7. A safety assembly according to claim 5, wherein the laser diode is configured to emit light with a modulation frequency in excess of 100 Hz.

8. A safety assembly according to claim 5, wherein the laser diode is configured such that in use, the emitted light has a wavelength distinct from wavelengths of a main laser comprised in the laser-directed energy weapon.

9. A safety assembly according to claim 4, wherein the safety assembly comprises a radio frequency emitter associated with the control system, and a radio frequency receiver associated with the optical device, the radio frequency emitter and receiver being arranged in use to emit and receive respectively a specific frequency signal, wherein in an absence of receipt of the specific frequency signal the light source is disabled.

10. A safety assembly according to claim 1, wherein the optical device comprises a retro-reflector, and wherein the control system comprises a light source, and wherein when attached to the target, the optical device provides a reflected light beam to the photodetector.

11. A safety assembly according to claim 1, wherein the optical device is configured to provide a wide-angle light beam.

12. A safety assembly according to claim 1, wherein the control system comprises one or more dichroic mirrors.

13. A safety assembly according to claim 1, wherein the processing unit is arranged to output a PERMIT signal upon determining that the received light beam has the one or more predetermined attributes and to not output a PERMIT signal in an absence of the determination.

14. A safety assembly according to claim 13, wherein the processing unit is arranged to output an INHIBIT signal in the absence of the determination.

15. A safety assembly according to claim 1, wherein the control system further comprises an aperture arranged with respect to the photodetector to constrict a field of view of the photodetector.

16. A safety assembly according to claim 1, wherein the safety assembly is configured to attach to the laser-directed energy weapon, such that when attached, a field of view of the photodetector aligns with a laser-directed energy weapon boresight.

17. A safety assembly according to claim 1, further comprising the target.

18. A laser-directed energy weapon safety system comprising:
a main laser configured to fire towards a target;
a control system comprising a photodetector and a processing unit;
an optical device, configured to attach to the target, such that when attached, the optical device provides a light beam to the photodetector for training use of a laser-directed energy weapon; and
a user interface configured to enable a training mode or a combat mode, wherein in the training mode, the control system and the optical device is activated and wherein in the combat mode, the control system and the optical device are disabled,
wherein; the processing unit is arranged to compare a light beam received by the photodetector against one or more predetermined attributes, and to permit the main laser to fire only when the received light beam is determined to have the one or more predetermined attributes.

19. A method of preventing firing during training of a laser-directed energy weapon, comprising:
attaching an optical device to a target;
attaching a photodetector to the laser-directed energy weapon;
receiving an input to select a training mode or a combat mode;
in response to receiving a selection of the training mode, providing a light beam from the optical device to the photodetector for training use of a laser-directed energy weapon; and
comparing the light beam received by the photodetector against one or more attributes,
wherein only upon determining that the light beam has the one or more attributes, permitting the laser-directed energy weapon to fire, and
in response to receiving a selection of combat mode, disabling the optical device from providing the light beam.

20. A method according to claim 19, wherein permitting the laser-directed energy weapon to fire comprises outputting a PERMIT signal from a processing unit.

* * * * *